(12) United States Patent
Bickel

(10) Patent No.: US 7,684,940 B2
(45) Date of Patent: Mar. 23, 2010

(54) METHOD AND SYSTEM TO IDENTIFY GROUNDING CONCERNS IN AN ELECTRIC POWER SYSTEM

(76) Inventor: Jon A. Bickel, 3123 Monarch Dr., Murfreesboro, TN (US) 37129

( * ) Notice: Subject to any disclaimer, the term of this patent is extended or adjusted under 35 U.S.C. 154(b) by 406 days.

(21) Appl. No.: 11/729,180

(22) Filed: Mar. 28, 2007

(65) Prior Publication Data

US 2008/0238436 A1    Oct. 2, 2008

(51) Int. Cl.
G01R 31/08    (2006.01)
G06F 17/40    (2006.01)

(52) U.S. Cl. .......................... 702/59; 702/58; 702/64; 700/293; 324/509; 324/512

(58) Field of Classification Search .................. 702/59, 702/58, 64
See application file for complete search history.

(56) References Cited

U.S. PATENT DOCUMENTS

| | | | | |
|---|---|---|---|---|
| 3,699,494 | A * | 10/1972 | Thompson et al. ........... | 439/100 |
| 4,020,394 | A | 4/1977 | Potash ........................ | 361/45 |
| 5,218,307 | A * | 6/1993 | Hiller ......................... | 324/541 |
| 7,023,680 | B1 | 4/2006 | Johnson et al. ............. | 361/111 |
| 7,272,518 | B2 | 9/2007 | Bickel et al. ................. | 702/61 |
| 7,349,815 | B2 | 3/2008 | Bickel et al. ................. | 702/60 |
| 2003/0043515 | A1 | 3/2003 | Brungs et al. ............... | 361/42 |
| 2004/0024545 | A1 | 2/2004 | Tian ............................ | 702/60 |
| 2005/0040809 | A1 | 2/2005 | Uber, III et al. ............. | 324/117 |
| 2005/0127891 | A1 * | 6/2005 | Bae et al. ...................... | 324/72 |
| 2005/0212526 | A1 | 9/2005 | Blades ......................... | 324/543 |

FOREIGN PATENT DOCUMENTS

EP    1669767 A1    6/2006
WO    WO 2007/005548    1/2007

OTHER PUBLICATIONS

Selected pages from NEC Handbook (10$^{th}$ Edition, 2005), 13 pages.
Written Opinion corresponding to co-pending International Patent Application Serial No. PCT/US2008/003861, European Patent Office, dated Aug. 13, 2008, 7 pages.
International Search Report corresponding to co-pending International Patent Application Serial No. PCT/US2008/003861, European Patent Office, dated Aug. 13, 2008, 6 pages.

* cited by examiner

*Primary Examiner*—Hal D Wachsman

(57) ABSTRACT

A method and system to detect and evaluate improper grounding/grounded bonds in an electrical power system is disclosed. An example method is detecting improper grounding in an electrical power system having a plurality of monitoring devices coupled to a grounded conductor and a grounding conductor. Data of the voltage between the grounded conductor and the grounding conductor is received from the plurality of monitoring devices. The spatial orientation of the data from the plurality of monitoring devices is determined within a hierarchy of the electrical power system. The voltage data received from the plurality of monitoring devices is compared to determine a bond (or lack of a bond) between the grounded conductor and the grounding conductor.

22 Claims, 8 Drawing Sheets

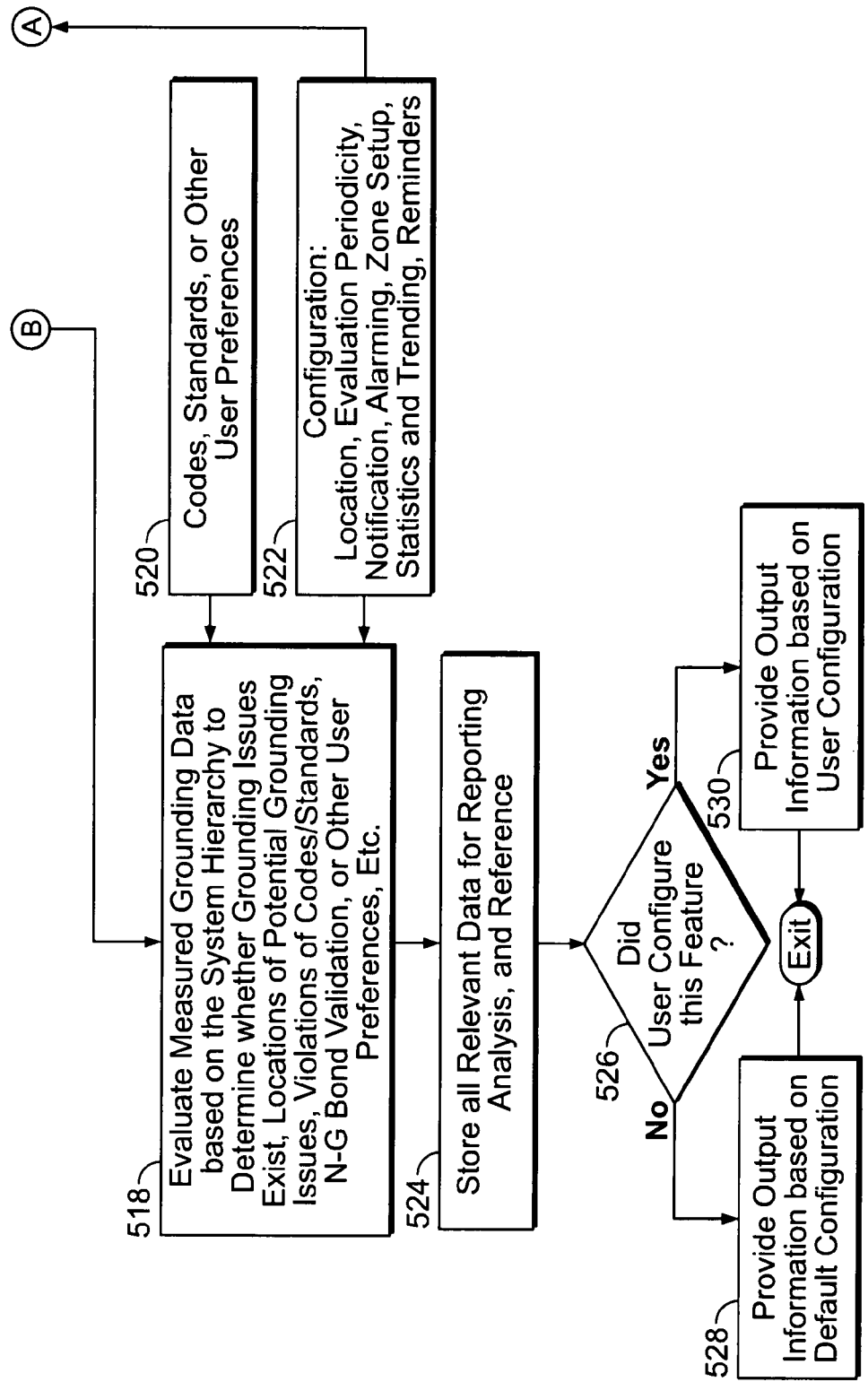

US 7,684,940 B2

METHOD AND SYSTEM TO IDENTIFY GROUNDING CONCERNS IN AN ELECTRIC POWER SYSTEM

FIELD OF THE INVENTION

The present invention relates generally to power monitoring systems, and, in particular, to a system and method for automatically detecting an improper grounded-grounding (N-G) bond in an electrical power system.

BACKGROUND OF THE INVENTION

It has been a long established fact that wiring and grounding inadequacies may result in many potential electrical vulnerabilities. In fact, a well known Electric Power Research Institute (EPRI) study in the 1990s stated that as much as 80% of power quality problems relate to inadequate wiring or grounding. Because of the frequency of wiring errors and the resulting potential for loss of life, property, product, and revenue, it is important to provide electrical energy users with capabilities that help determine unintentional (and even intentional) wiring errors that would have been otherwise overlooked.

There are several functions served by properly grounding an electrical system, some which are mentioned above. The National Electrical Code (NEC) and/or local electrical codes typically govern the general requirements for grounding and bonding of electrical installations. Some specific requirements include: 1) systems, circuits, and equipment required, permitted, or not permitted to be grounded; 2) circuit conductor or conductors to be grounded on grounded systems; 3) location of grounding connections; 4) types and sizes of grounding and bonding conductors and electrodes; and 5) methods of grounding and bonding.

Ultimately, these codes are intended to provide guidelines that facilitate the safety of equipment and personnel. Other objectives of suitable grounding configurations include providing a path for dissipating high energy electrical discharges, preventing static build-up, and establishing an equipotential voltage reference point for the electrical system. There are other important standards and guidelines that discuss wiring and grounding beyond those concerned with safety as they relate to equipment and personnel. The IEEE Emerald Book (IEEE 1100, Recommended Practice for Powering and Grounding Electronic Equipment) describes methods "to enhance equipment performance from an electric powering and grounding standpoint, while maintaining a safe installation as prescribed by national and local electric code requirements."

An effective grounding path is defined by the NEC as "an intentionally constructed, permanent, low-impedance electrically conductive path designed and intended to carry current under ground-fault conditions from the point of a ground fault on a wiring system to the electrical supply source and that facilitates the operation of the overcurrent protective device or ground fault detectors on high-impedance grounded systems." A key aspect of this definition is that the ground path is meant to be used "under ground-fault conditions," and not during steady-state operation. A primary reason ground paths are not meant to provide a return path for the current during steady-state conditions is that equipment may become inadvertently energized, posing a safety hazard to personnel. Another reason to avoid ground currents is the potential to introduce equipment interference problems into the electrical system.

The 2005 NEC Section 250.30(A)(1) states that "an unspliced system bonding jumper in compliance with 250.28(A) through (D) that is sized based on the derived phase conductors shall be used to connect the equipment grounding conductors of the separately derived system to the grounded conductor (neutral). This connection shall be made at any single point on the separately derived system from the source to the first system disconnecting means or overcurrent device, or it shall be made at the source of a separately derived system that has no disconnecting means or overcurrent devices. The NEC allows for a single neutral-ground bond (connection) at the service entrance or at any separately derived system."

FIG. 1 generally illustrates a properly bonded electrical system 10 having a utility service entrance 12, a main switchgear 14, a step down transformer 16 and a panelboard 18. Neutral (grounded) conductors 20 and grounding conductors 22 are provided for the components 12, 14, 16 and 18. FIG. 1 illustrates a "single" point of bonding 24 between the grounding conductors 22 and the grounded conductor 20 on each separately derived component (one at main switchgear 14 and the other at the step-down transformer 16).

FIG. 2 generally illustrates the electrical system 10 in FIG. 1 in an improperly (or "illegally") bonded state. FIG. 2 illustrates a "single" point of bonding between the grounding conductor 22 and the grounded conductor 20 for each separately derived component as explained above in FIG. 1, but also has a bond 26 between the grounding conductor 22 and the grounded conductors 20 on the panel board 18. This additional neutral-ground (N-G) bond 26 at the panelboard 18 will allow current to circulate on the grounding conductor 22 during steady-state conditions creating both potentially hazardous electrical conditions and equipment operational issues.

What is needed, therefore, is a detection system to determine automatically the presence of potential improper grounded-grounding conductor configurations in an electrical power system. There is a further need for a system to determine automatically the location of improper grounded-grounding conductor configurations. There is also a need for a system that determines the absence of an expected grounded-grounding bond in an electrical power system. Aspects of the present invention are directed to fulfilling these and other needs.

SUMMARY OF THE INVENTION

Briefly, according to an aspect of the present invention, a method of detecting improper grounding in an electrical power system having a plurality of monitoring devices coupled to a grounded conductor and a grounding conductor or grounding plane, comprising: receiving data of the voltage between the grounded conductor and the grounding conductor from the plurality of monitoring devices; determining the spatial orientation of the data from the plurality of monitoring devices within a hierarchy of the electrical power system; and comparing the voltage data received from the plurality of monitoring devices to determine a bond between the grounded conductor and the grounding conductor. A computer readable medium may be encoded with instructions for directing a controller to perform the foregoing method.

The method may further comprise determining the location in the electrical power system of a bond between the grounded conductor and the grounding conductor by comparing the voltage data from some of the plurality of monitoring devices. The location may be determined by designating the location of the monitoring device which reads the lowest voltage between the grounded conductor and the grounding conductor as the location of the bond. The method may further comprise displaying at least part of the electrical power system and the location of the bond between the grounded conductor and grounding conductor. The method may further comprise comparing a location of a known bond with the determined bond location. The method may further comprise confirming the existence of the known bond. The method may further comprise determining the existence of an improper bond. The method may further comprise determining the lack of a known bond in the hierarchy of the electrical power system.

According to another aspect of the present invention, a system to determine a bond between a grounding conductor or grounding plane and a grounded conductor in an electrical power system, the electrical power system including a plurality of monitoring devices, the system comprising: a central controller coupled to the plurality of monitoring devices, the central controller receiving data indicative of the potential voltage between the grounding conductor and the grounded conductor for each of the plurality of monitoring devices; a memory coupled to the central controller including hierarchy data relating to the electrical power system, the central controller including correlating the data received from the plurality of monitoring devices in a spatial context; and wherein the central controller determines the bond between the grounding conductor or grounding plane and the grounded conductor by the data received from the plurality of monitoring devices.

The controller may determine the location in the electrical power system of the bond by comparing the voltage data from at least some of the plurality of monitoring devices. The system may further comprise a display coupled to the central controller. The location may be determined by designating the location of the monitoring device which reads the lowest voltage between the grounded conductor and the grounding conductor or grounding plane as the location of the bond. The display may show at least part of the electrical power system and the location of the bond between the grounded conductor and grounding conductor or grounding plane. The central controller may compare a location of a known bond with the determined bond location. The central controller may confirm the existence of the known bond. The central controller may determine the existence of an illegal bond. The central controller may determine the lack of a known bond in the hierarchy of the electrical power system. The display may show a circuit diagram of at least one component of the electrical system.

According to another aspect of the present invention, a method of detecting improper grounding in an electrical power system having a plurality of monitoring devices coupled to a grounded conductor and a grounding conductor, comprising: receiving data of voltage between the grounded conductor and the grounding conductor or grounding plane sensed from the plurality of monitoring devices; determining the spatial orientation of the data from the plurality of monitoring devices within a hierarchy of the electrical power system; comparing the voltage data received from the plurality of monitoring devices to determine the location of the monitoring device sensing the lowest voltage between the grounded conductor and the grounding conductor; and designating the location of a bond between the grounded conductor and the grounding conductor or grounding plane as the location of the determined monitoring device.

The method may further comprise displaying to a user an indication as to whether the bond is a proper bond. The method may further comprise automatically determining, based on the hierarchy, a first location where a proper neutral-ground bond should exist, and, when such a bond does not exist, displaying to a user an indication that the first location requires a neutral-ground bond.

The foregoing and additional aspects of the present invention will be apparent to those of ordinary skill in the art in view of the detailed description of various embodiments, which is made with reference to the drawings, a brief description of which is provided next.

BRIEF DESCRIPTION OF THE DRAWINGS

The foregoing and other advantages of the invention will become apparent upon reading the following detailed description and upon reference to the drawings.

FIGS. 5A-5B are a flow chart diagram of a grounded-grounding bond detection and evaluation algorithm used by the grounded-grounding bond detection system in FIG. 3;

Figure 1:
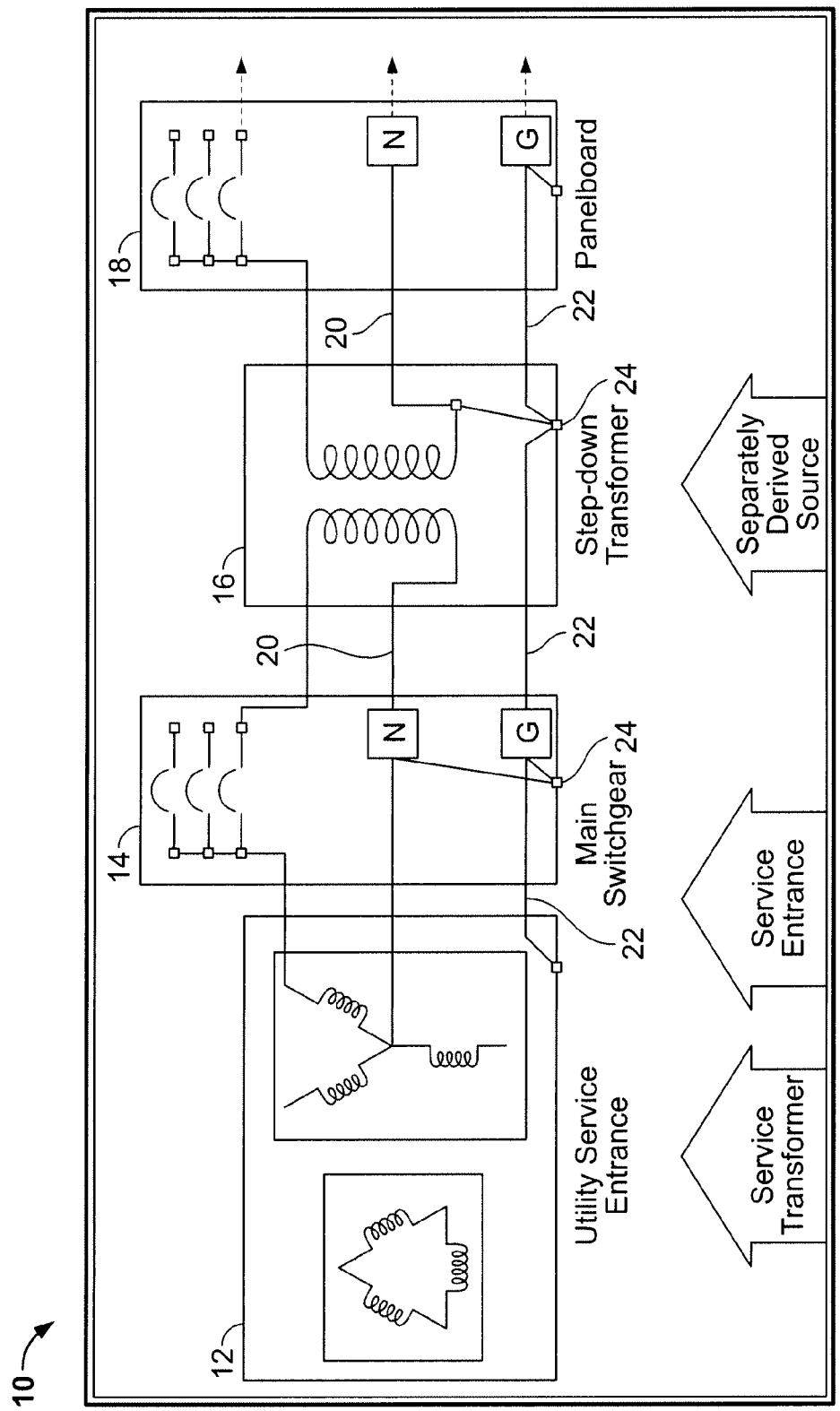
FIG. 1 is functional block diagram of a properly bonded electrical system.
Figure 2:
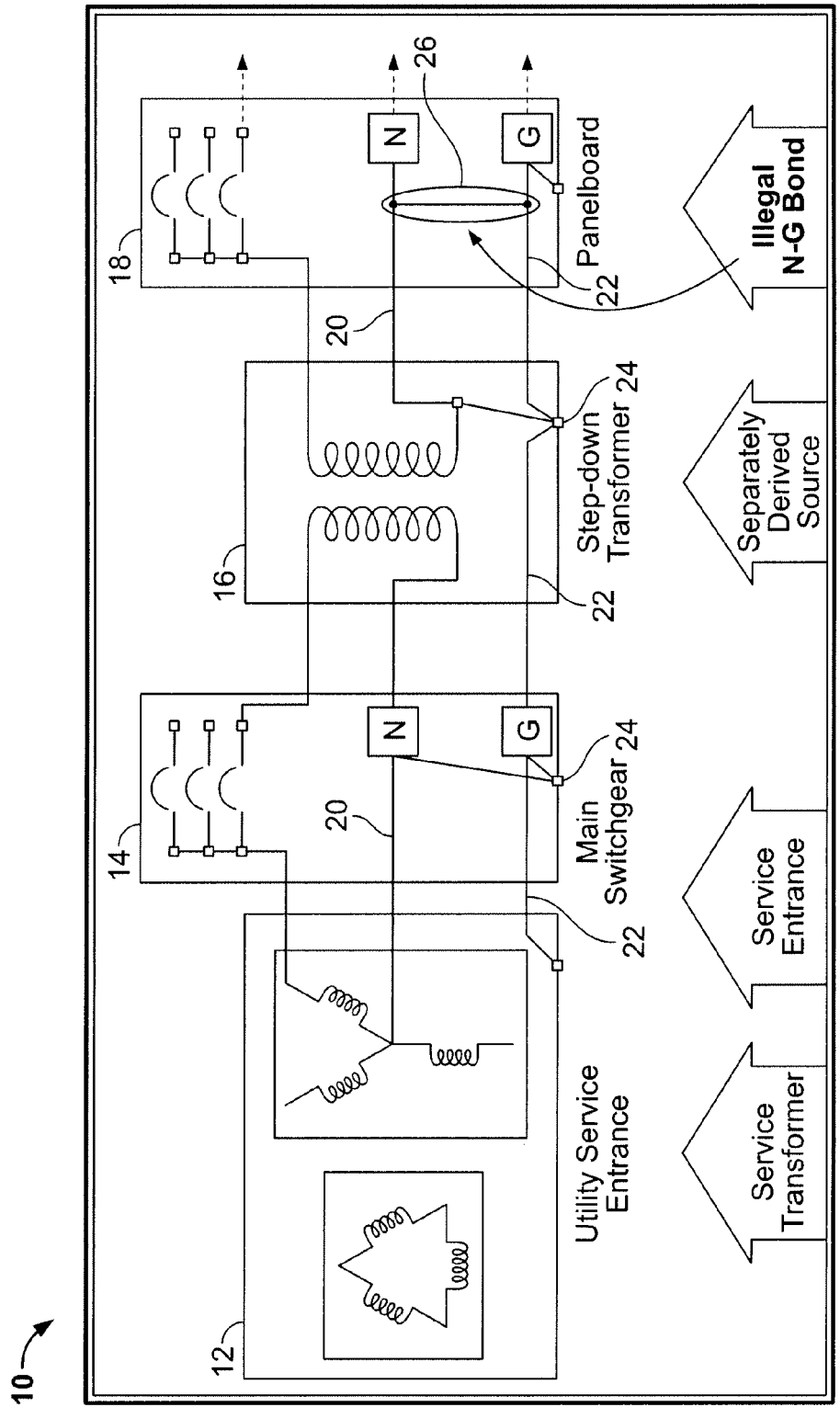
FIG. 2 is a functional block diagram of an improperly bonded electrical system.

While the invention is susceptible to various modifications and alternative forms, specific embodiments have been shown by way of example in the drawings and will be described in detail herein. It should be understood, however, that the invention is not intended to be limited to the particular forms disclosed. Rather, the invention is to cover all modifications, equivalents, and alternatives falling within the spirit and scope of the invention as defined by the appended claims.

DETAILED DESCRIPTION OF THE ILLUSTRATED EMBODIMENTS

Aspects of the invention allow the user to identify potential issues with grounding configurations on an electrical power system. Ultimately, the types of electrical system vulnerabilities that are addressed by the present invention include: fire hazards, electrocution hazards, equipment misoperation, equipment damage and equipment degradation.

Figure 3:
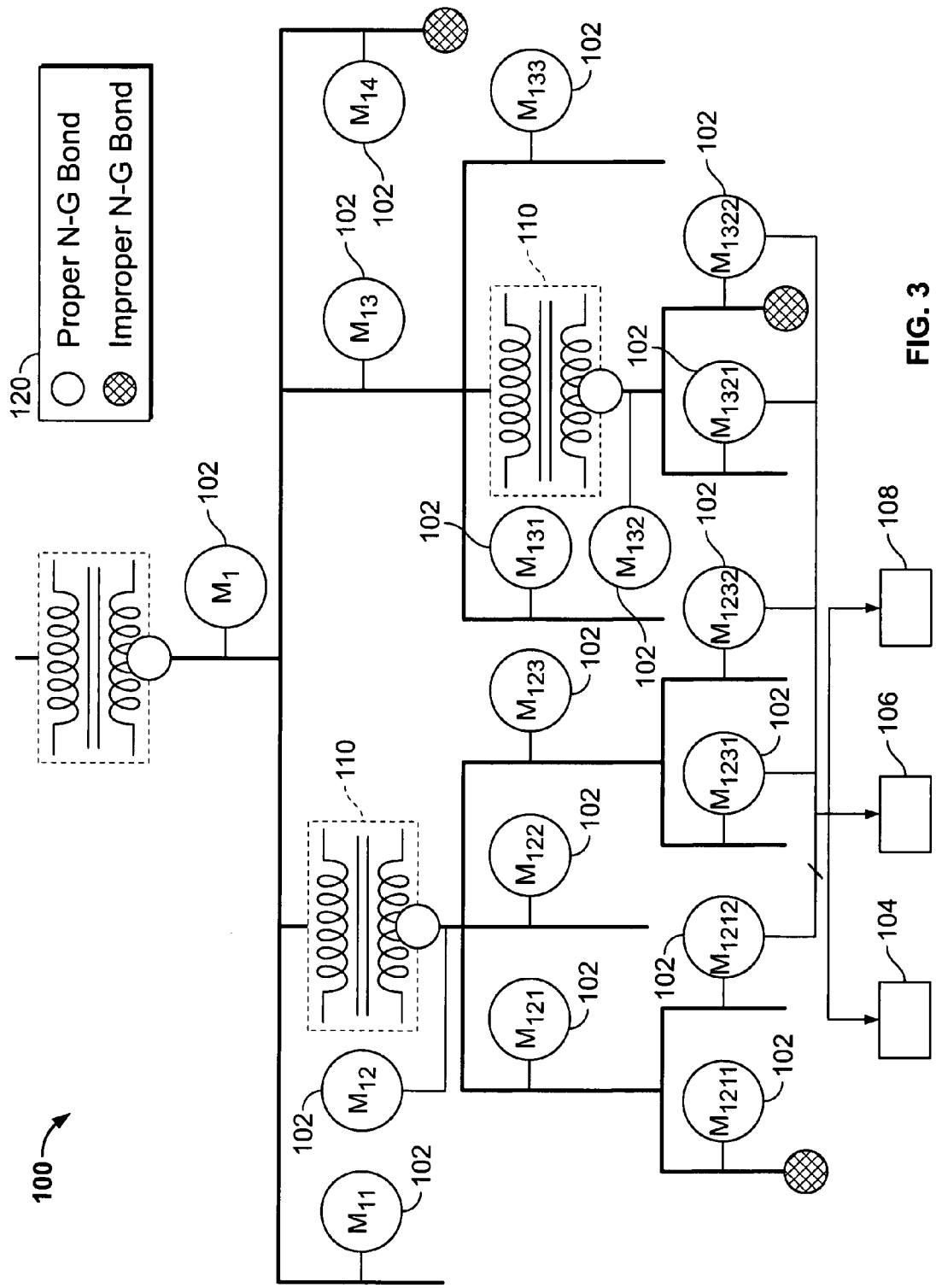
FIG. 3 is a functional block diagram of an example power system showing a grounded-grounding bond detection system.

Turning now to FIG. 3, an electrical power system such as a utility system 100 having multiple monitoring devices 102 (labeled M) providing sensed data from discrete locations around the utility system 100 such as voltage potential measurements between grounded and grounding conductors. The data from each monitoring device 102 is communicated to an automated data alignment system 104, an automated hierarchy classification system 106 and an automated grounding alert system 108. The data is temporally aligned automatically in the automated data alignment system 104 and produces data that is aligned such that it represents the data when it was actually sensed simultaneously (or nearly simultaneously for the pseudo-temporal alignment case) by each of the monitoring devices 102 in the utility system 100. The hierarchy classification system 106 automatically learns the hierarchy of the monitoring devices 102 present in the utility system 100 and their spatial relationships within the power monitoring system relative to one another. It should be noted that each monitoring device 102 shown in FIG. 3 is communicatively coupled to the automated data alignment system 104, the automated hierarchy classification system 106, and the automated grounding alert system 108. Only several representative communication links and monitoring devices are shown for the sake of clarity.

Each monitoring device 102 measures (samples, collects, etc.) data from the utility system 100, and quantifies this data into characteristics that may be analyzed by a computer or analysis system. In this example, the monitoring devices 102 may be based on a POWERLOGIC® Series 3000/4000 Circuit Monitor or a POWERLOGIC® ION7550/7650 Power and Energy Meter available from Schneider Electric or any other suitable monitoring device such as a circuit breaker, a relay, a metering device, or a power meter. There may also be multiple monitoring devices with the capabilities of the monitoring device 102 in the utility system 100. For the sake of simplicity, only a few monitoring devices 102 are shown coupled to the automated data alignment system 104, the automated hierarchy classification system 106 and the automated grounding alert system 108, though it is understood that all the monitoring devices 102 in FIG. 3 may be in communications with the systems 104, 106 and 108. Further, the multiple monitoring devices 102 may be in communication with other types of analysis or evaluation systems to monitor the performance of the utility system 100.

The data alignment system 104 aligns data, such as voltage, current, time, events, and the like, from the multiple monitoring devices 102 in the utility system 100. When data from all the monitoring devices 102 is aligned to the same point (or approximately the same point based on pseudo-temporal alignment) in time that the data occurred, the data can be put into a temporal or pseudo-temporal context from which additional decisions regarding hardware and software configuration can be automatically made or recommended. Of course it is to be understood, that the data alignment system 104 may be a desirable option, but the utility system 100 may be monitored without the data alignment system 104.

The measured data from various meters may be synchronized or approximately synchronized with each other within a temporal or pseudo-temporal context. Temporal alignment is more precise than pseudo-temporal alignment. Pseudo-temporal alignment takes data within an acceptable range based on load changes in the system. Pseudo-temporal alignment systems typically utilize a global positioning system (GPS) or network time protocol (NTP) for clock synchronization. Automatic temporal alignment implementations are described in pending U.S. patent application Ser. No. 11/174,099, filed Jul. 1, 2005, entitled "Automated Precision Alignment of Data in a Utility Monitoring System."

The hierarchy classification system 106 characterizes the power monitoring system layout of the utility system 100, which is essential to understanding and characterizing the utility system 100. The system 106 characterizes how the monitoring devices in the utility system 100 are connected to one another. Power monitoring devices typically provide only the electrical system's operating parameters, but do not provide information on how the parameters at different monitoring points on the electrical system relate to each other spatially. Having the hierarchy of an electrical system puts the operating parameters of multiple monitoring devices into spatial context with each other. This spatial context gives the user a more powerful tool to quickly locate and resolve problems such as an improper N-G bond to troubleshoot system problems, improve system efficiencies, predict failures and degradation, locate the source of disturbances, or model system responses. Automated hierarchy classification implementations are described in granted U.S. Pat. No. 7,272,518, filed Jul. 1, 2005, entitled "Automated Hierarchy Classification in Utility Monitoring Systems," the entirety of which is incorporated herein by reference.

The hierarchy classification system 106 includes monitoring system software that collects data from the monitoring devices 102 on the utility system 100 and automatically determines the hierarchy of the utility system 100 with little or no user input. The level of detail given by the hierarchy classification system 106 correlates with the number and extent of monitoring devices 102 in the utility system 100. As additional monitoring devices are added, the auto-learned hierarchical algorithm automatically incorporates them into the determined hierarchical structure. It is to be understood that other processes such as preloading hierarchy data to the analysis and evaluation systems may be used in place of a dedicated hierarchy system such as the hierarchy classification system 106.

In the case of a power system hierarchy, an objective is to order devices in the power system so as to represent the true connection layout of the power system. Determining the hierarchy of a power system provides important information that can be used to solve problems, increase equipment and system performance, improve safety, and save money. The level of detail in a power system hierarchy will depend on both the number of elements or nodes that are being monitored and the node's ability to provide feedback to the auto-learned hierarchy algorithm in the monitoring system software running on the system 106.

Generally, the hierarchy classification system 106 utilizes an auto-learned hierarchy algorithm in the monitoring system software that is based on rules and statistical methods. Periodically, the monitoring system software polls each monitoring device 102 in the utility system 100 to determine certain characteristics or parameters of the utility system 100 at that node (represented by a monitoring device). Multiple samples of specified parameters are taken from each monitoring device in the system 100 at the same given point in time. Once a time-series of the parameter data is collected from each monitoring device in the utility system 100, the hierarchy classification system 106 analyzes the data and identifies the relationships or links among the monitoring devices 102 with respect to the time the data sample was taken and the associated value of the data sample. This analysis may be performed periodically to increase the probability that the hierarchy is accurate, or to ascertain any changes in the hierarchy. It may also be performed if the monitoring system software detects the addition of a new element or node to the power monitoring system. Once this iterative process reaches some predetermined level of statistical confidence that the determined layout of the utility system 100 is correct, the auto-learned hierarchy algorithm ends. The final layout of the utility system 100 may be presented to the user for concurrence. As each monitoring device's data is evaluated over time (the learning period) with respect to all other monitoring devices using the auto-learned hierarchy algorithm, a basic layout of the hierarchical structure of the utility system 100 is determined based on the monitoring points available.

The grounding alert system 108 receives data from two or more voltage, current and/or power monitoring devices 102 to alert the end-user that potential improper N-G (grounded-grounding conductor) configurations exist in the utility system 100. Improper N-G configurations may include both excessive N-G bonds and the lack of a required N-G bond. The grounding alert system 108 includes rules that define proper and improper N-G bonds. These rules can be user-defined based upon, for example, local electrical codes, or they can be derived from national codes or standards, such as the National Electrical Code (NEC) code. As will be explained below, the end-user may (at their discretion) also be provided the general location within their electrical power system hierarchy of potential grounding issues for further reference or investigation. The end-user (at their discretion) may also configure and enable or disable specified zones as desired. The end-user (at their discretion) may trend changes in grounding characteristics between any two or more monitoring devices. The end-user can be provided notification of an open neutral conductor between any two or more monitoring devices.

Figure 4:
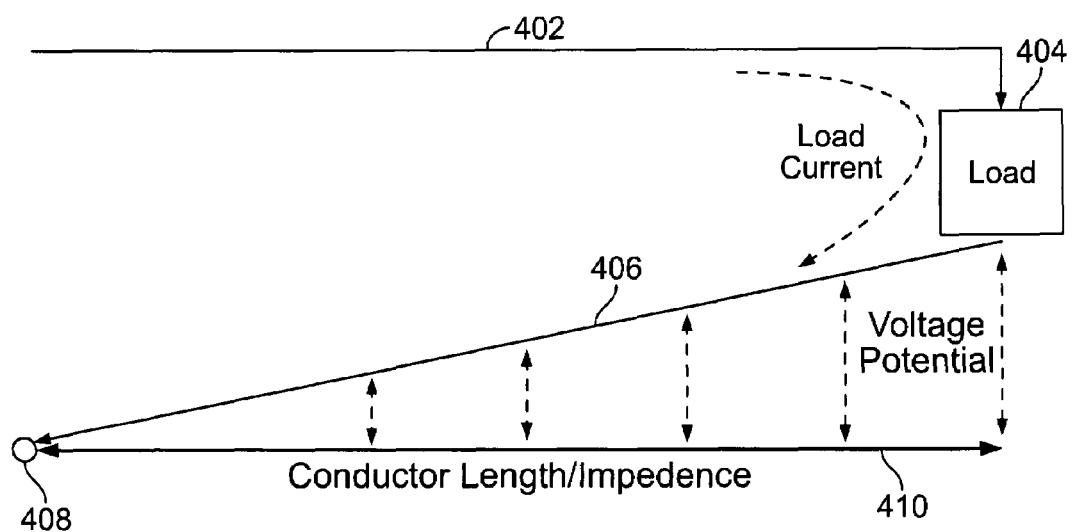
FIG. 4 is a voltage graph of the voltage detected on a load with grounded and grounding conductors to determine a grounded-grounding bond.

There are inherent electrical characteristics measured and/or derived from the monitoring devices 102 in FIG. 3 that may be analyzed to determine and provide an indication of whether an improper N-G bond potentially exists in a given electrical energy system. In an example, the voltage potential between the grounded (neutral) conductor and a grounding plane may be analyzed to indicate the proximity of a bond such as a bond between the grounded conductor and the grounding plane by deviation from an expected higher voltage potential. FIG. 4 is a diagram that illustrates this effect on voltage potential relative to proximity to an effective bond point 408 (where the grounded conductor is bonded to a grounding conductor or plane). Current is carried on a load (phase) conductor 402 to a load 404 and returned on a grounded (neutral) conductor 406 to complete the circuit. Ceteris paribus, each conductor's impedance will increase with its length. As a result, there is a corresponding reduction in the voltage (voltage drop) along each grounding conductor 410 and grounded conductor 406 (ground and neutral) due to the conductors' impedance and the flow of current (according to Ohm's Law).

As the physical distance from the N-G bond point 408 is increased, the voltage potential between the grounded (neutral) and grounding conductors 406 and 410 increases. As mentioned above, the purpose of the grounded (neutral) conductor 406 is to carry steady-state current from the load 404 back to the source. Therefore, the basis of the increase in the voltage potential between the grounded (neutral) and grounding conductors (or path) 406 and 410 is the effect of the steady-state current flow along the impedance (which directly correlates with the conductor's length) of the grounded (neutral) conductor 406. The voltage potential between the grounded (neutral) conductor 406 and the grounding conductor 410 (or path) is greatest at the furthest point from the N-G bond point 408, and decreases as the N-G bond 408 is approached as shown in FIG. 4, assuming the electrical system's grounding scheme is configured properly.

Should the grounded (neutral) conductor 406 open up, a safety risk to the user is presented depending upon where the improper N-G bond is located. If there is an improper N-G bond downstream from the opening point, the load will continue to operate because the load current will flow on the grounding conductor 410 via the improper bond. In this case, personnel are exposed to a shock hazard by becoming a lower impedance path to ground when energized equipment is touched. If no improper N-G bonds exist downstream from the opening point (including at the load 404), the load 404 will cease to operate because no return path for the load current is available. A safety risk exists for users who mistakenly believe a load does not have voltage at its terminals because the load is not operating when in fact voltage is present. A three-phase load will continue to operate if the grounded conductor 406 is opened because the unbalanced currents will flow into the other phases. However, a safety risk still exists for users who mistakenly come in contact with the grounded conductor 406.

When an electrical power system includes multiple step-up/step-down transformers such as example transformers 110 in FIG. 3, there should be additional proper N-G bonds per NEC code requirements. Electrical data taken from each monitoring device 102 on the utility system 100 can be used to provide information to the user regarding detected improper N-G bonds. The utility system 100 in FIG. 3 incorporates the grounding alert system 108 to determine improper grounding. A determination of the power system's hierarchy is made and stored for purposes of improper N-G bond detection and analysis. Each monitoring device 102 coupled to the grounding alert system 108 can measure the N-G voltage (Vng), and communicating data indicative of the measured N-G voltage to a remote system (another monitoring device, computer, etc.), such as, in this example, the grounding alert system 108, for evaluation. The Vng voltage at each capable monitoring point is evaluated and compared against other Vng voltages measured at other monitoring points to determine whether improper N-G bonds are present in the system. For example, a lower Vng at a point further away from a known bond may indicate an improper N-G bond point. Furthermore, the magnitude of Vng at each monitoring device is used to locate the general area of an improper N-G bond. The lower the voltage value of Vng, the closer in proximity the point is to the general area of the improper N-G bond. In addition, the phase angle of Vng may be evaluated against each of the three phase voltages to determine which phase(s) is the source(s) with the improper N-G bond.

As shown in FIG. 4, electrical circuits (with no separately derived sources) should exhibit an increasing $V_{ng}$ as the measuring point moves further out on the circuit towards the load 404. If $V_{ng}$ stays constant or even decreases with respect to two or more monitoring points on the system 100 as the distance away from the bond point 408 increases, this may indicate an improper N-G bond. If a separately derived source (e.g., a transformer) exists in the utility system 100, the monitoring devices 102 will be able to determine their existence based on phase voltage levels measured at each monitoring point. Again, $V_{ng}$ should increase as the points of measurement are further away from the separately derived source. Voltages, currents, loads, harmonic distortions, power factors, etc. may be used to determine the physical proximity of monitoring devices on one hierarchical level to those monitoring devices that have a direct hierarchical link. This information may be useful when determining whether monitoring devices at different levels in the power system hierarchy are also located near each other. In this example, it should be expected that the measured N-G voltages will be very close to the same measurement for the respective monitoring devices on both hierarchical levels.

To illustrate a simple example of an implementation of this invention, both the power monitoring system hierarchy and the data in Table 1 below are determined via the automated hierarchy system 104 and measurements from the monitoring devices 102 in FIG. 3. The system hierarchy is determined either automatically such as described above or manually via a stored hierarchical data file. Table 1 provides stored N-G voltage data received from various monitoring devices 102 on the utility system 100. The N-G voltage data is preferably automatically temporally aligned. The data from the monitoring devices 102 may be psuedo-temporally aligned using a network protocol such as SNTP. Global positioning system (GPS) signals could also be used to pseudo-temporally align the data received from the monitoring devices 102, which may be equipped with GPS capabilities.

With knowledge of both the hierarchy of the utility system 100 and N-G voltages taken from various points around the utility system 100 by the monitoring devices 102, a virtual representation of the electrical system's potential grounding issues may be ascertained. The following exemplary Table 1 identifies $V_{ng}$ values for each corresponding meter:

TABLE 1

N-G Voltage Data from Electrical Power System.

| Meter | $V_{ng}$ (volts) |
|---|---|
| $M_1$ | 0 |
| $M_{11}$ | 1.5 |
| $M_{12}$ | 0 |
| $M_{13}$ | 2.1 |
| $M_{14}$ | 0 |
| $M_{121}$ | 0.5 |
| $M_{122}$ | 1.9 |
| $M_{123}$ | 2.3 |
| $M_{131}$ | 3.5 |
| $M_{132}$ | 0 |
| $M_{133}$ | 3.2 |
| $M_{1211}$ | 0 |
| $M_{1212}$ | 0.75 |
| $M_{1231}$ | 4.2 |
| $M_{1232}$ | 3.9 |
| $M_{1321}$ | 0.5 |
| $M_{1322}$ | 0 |

Once the user is notified and the problems are investigated, the user can re-evaluate the system to insure all improper N-G bonds have been adequately addressed. Periodic re-evaluations of the utility system 100 may also be performed at some time interval (per the configuration of the grounding alert system 108) as the utility system 100 may be altered and improper N-G bonds inadvertently added over time. It can also be continuously monitored by the system 100, and the user alerted to any potential issues via alarm from the system.

For example, Meter $M_{12}$ (shown in FIG. 3) measures 0 $V_{ng}$ volts and is known to be proximate to an expected or proper N-G bond with respect to the power system hierarchy. Based upon the relationships shown and described in connection with FIG. 4, it is expected that meters farther away from Meter $M_{12}$ should measure increasingly higher $V_{ng}$ values. Because the hierarchy is known, it is also known that Meter $M_{121}$ is downstream of and connected to Meter $M_{12}$ but is not a known location for a proper N-G bond. Meter $M_{121}$ measures 0.5 $V_{ng}$ volts, and this measurement is expected because Meter $M_{121}$ is farther away from Meter $M_{12}$. Based on the known hierarchy, it is also known that Meter $M_{1211}$ is also downstream of and connected to Meter $M_{121}$. However, Meter $M_{1211}$ measures 0 $V_{ng}$ volts, and this violates the expectation that Meter $M_{1211}$ should measure a higher N-G voltage than Meter $M_{121}$. As a result, the grounding alert system 108 flags Meter $M_{1211}$, as being near a potential improper N-G bond.

Similarly and still referring to the exemplary Table 1, Meter $M_{132}$ is known to be near the transformer 110 and therefore a proper N-G bond location. Thus, its $V_{ng}$ measurement is 0 volts as expected. From the hierarchy, it is known that Meter $M_{1322}$ is downstream of and connected to Meter $M_{132}$. As a result, $V_{ng}$ for Meter $M_{1322}$ is expected to be higher than $V_{ng}$ for Meter $M_{132}$. However, Table 1 shows that $V_{ng}$ for Meter $M_{1322}$ is actually 0 volts, which violates the expectation that its $V_{ng}$ should be higher than that of $M_{132}$. Therefore, the grounding alert system 108 flags Meter $M_{1322}$ as being near a potentially improper N-G bond. Should Meter 1322 (or any meter under consideration) be investigated and found to be legitimate, the user can validate the reading in the system and ignore that specific notification in the future. An exemplary algorithm for determining improper N-G bond locations is shown and described in connection with FIG. 5C below. These and other improper N-G bonds are shown schematically in FIG. 6, described below.

The grounding alert system 108 may be programmed with various analysis subroutines related to grounding data. For example, one subroutine may detect improper N-G bonds based upon the fundamental ground current flows as determined by the monitoring devices 102 with respect to the power system hierarchy. Another subroutine may detect improper N-G bonds based upon the fundamental power flows as determined by monitoring devices 102 with respect to the power system hierarchy. Another subroutine may detect improper N-G bonds based upon fundamental energy flows as determined by the monitoring devices 102 with respect to the power system hierarchy. Still another subroutine may detect improper N-G bonds based upon the data from any of the above subroutines at some frequency other than the fundamental or nominal frequency of the power system 100. In other words, instead of fundamental ground current flows, power flows, or energy flows, the subroutine in this example would detect improper N-G bonds based upon ground current flows, power flows, or energy flows at some frequency other than the fundamental or nominal frequency of the power system 100.

Figure 5A:
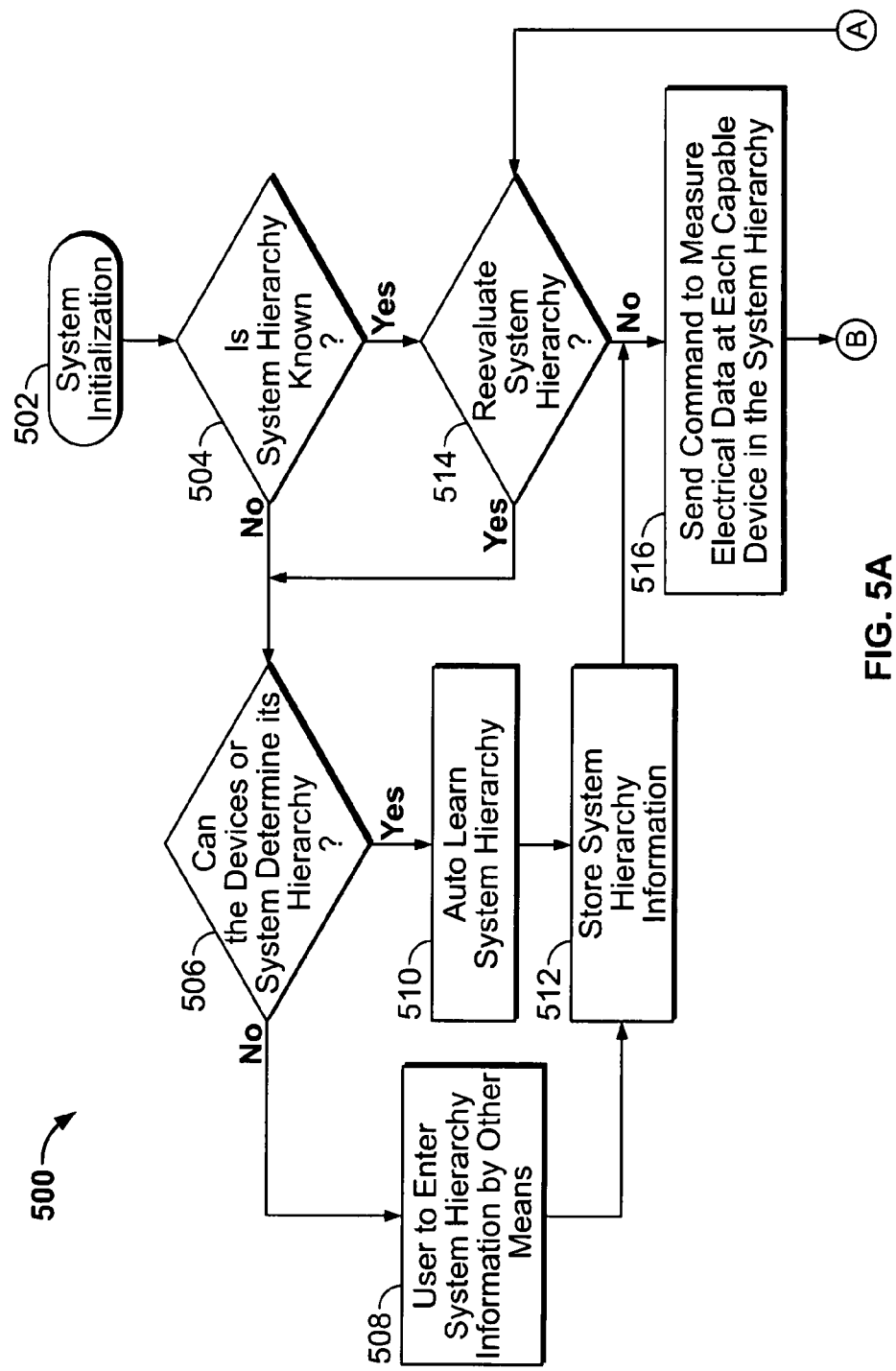
Figure 5C:
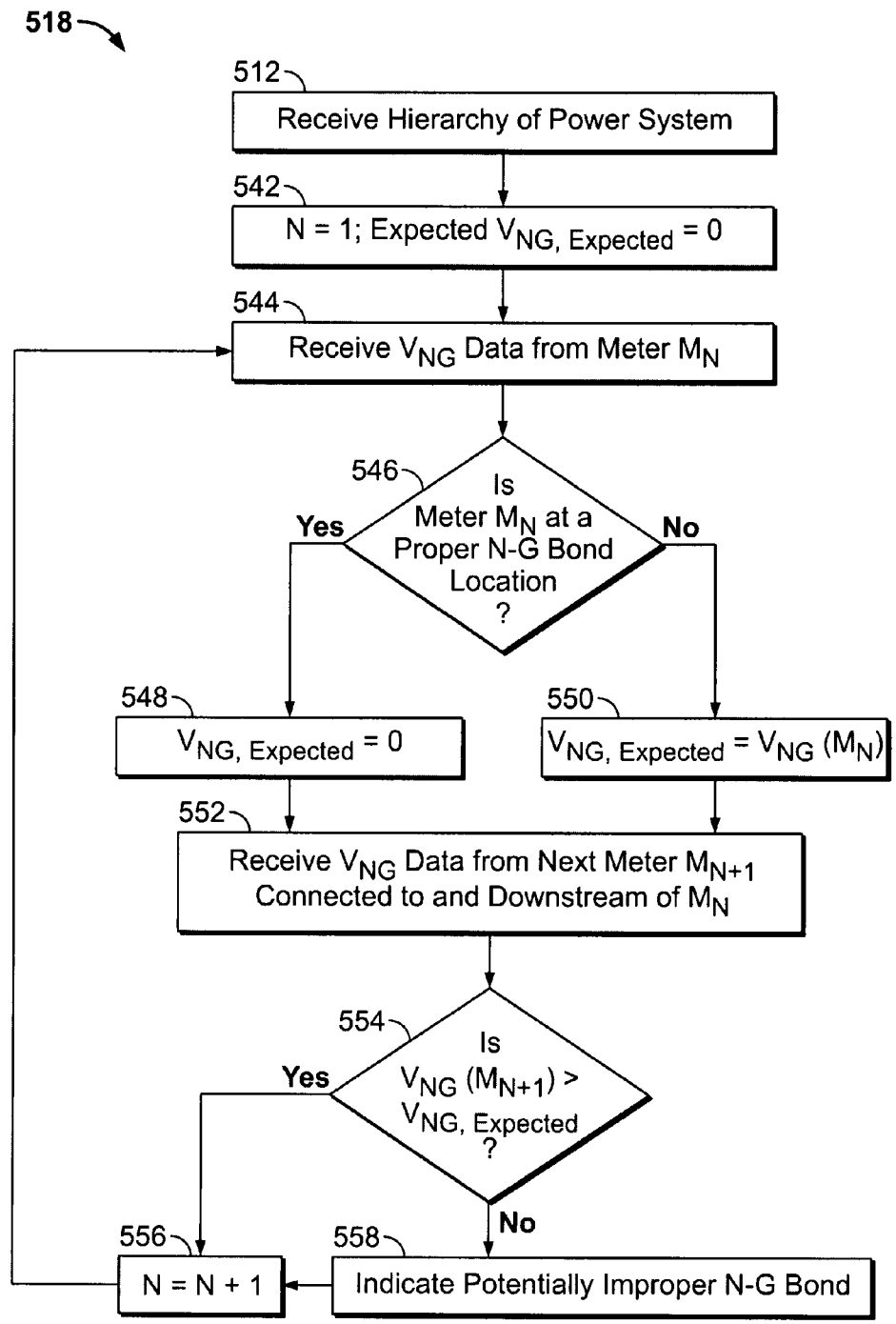
FIG. 5C is a flow chart diagram of an exemplary algorithm for detecting potentially improper N-G bonds according to an aspect of the present invention.

An example flow diagram 500 of an algorithm for processing and evaluating data for the purpose of analyzing improper grounding in the utility system 100 is shown in FIGS. 5A-5C. In this example, the algorithm includes machine readable instructions for execution by: (a) a processor, (b) a controller, and/or (c) any other suitable processing device. The algorithm may be embodied in software stored on a tangible medium such as, for example, a flash memory, a CD-ROM, a floppy disk, a hard drive, a digital versatile disk (DVD), or other memory devices, but persons of ordinary skill in the art will readily appreciate that the entire algorithm and/or parts thereof could alternatively be executed by a device other than a processor and/or embodied in firmware or dedicated hardware in a well known manner (e.g., it maybe implemented by an application specific integrated circuit (ASIC), a programmable logic device (PLD), a field programmable logic device (FPLD), discrete logic, etc.). Also, some or all of the machine readable instructions represented by the flowchart of FIG. 5A-5C may be implemented manually. Further, although the example algorithm is described with reference to the flowchart illustrated in FIG. 5A-5C, persons of ordinary skill in the art will readily appreciate that many other methods of implementing the example machine readable instructions may alternatively be used. For example, the order of execution of the blocks may be changed, and/or some of the blocks described may be changed, eliminated, or combined.

In an implementation, data from the monitoring devices 102 in FIG. 3 is evaluated to determine improper grounding by measuring voltage between the neutral and grounding conductors or grounding plane. The hierarchy of the utility system 100 may be divided into zones or specific areas as determined by the above-described hierarchy algorithm or as configured by the end-user. An alarm may be triggered and/or the end user may otherwise be notified by some means when any predefined (either by the user or by the system 100) threshold has been exceeded. Statistical methods that may be incorporated with the thresholds to analyze the data include, but are not limited to, correlations, averages, min/max, trending & forecasting, standard deviations, etc. Reminders or notices may include (but are not limited to) notifying the user of updated firmware, updated codes, updated standards, updated preferences, changes in the system hierarchy, disregarded alarms, or any other consideration as it relates to N-G bond evaluation and the user's power system.

Returning now to FIG. 5A, the algorithm 500 is initialized (502). The algorithm 500 determines whether the hierarchy of the electrical system such as the utility system 100 is known (504). If the hierarchy is not known, the algorithm 500 determines whether the automated hierarchy classification system 106 is installed (506). If the algorithm 500 cannot automatically learn the hierarchy by accessing the automated hierarchy classification system 106, the user will be prompted to enter the system hierarchy such as by providing an electronic file of the system hierarchy (508) or by manually entering the hierarchy. If the automated hierarchy classification system 106 is present, the algorithm 500 will automatically learn the hierarchy of the system from the automated hierarchy algorithm (510) as described above. Either the user-entered hierarchy or the automatically determined hierarchy of the power system 100 is stored for access by the algorithm 500 (512).

If the system hierarchy is known (504), the algorithm determines whether the known system hierarchy needs to be reevaluated (514). This is done by determining whether new components have been added or other alterations have been made to the electrical system, changing the system hierarchy. If a reevaluation is necessary, the algorithm loops back to block 506 to determine the new or revised hierarchy. In determining whether the hierarchy needs to re-evaluated, the algorithm 500 may analyze configuration data 522, including revised communication link configurations in the power monitoring system, location, evaluation periodicity, notification, alarming, zone setup, statistics and trending, or reminders as part of that determination.

The algorithm sends commands to all monitoring devices 102 in the utility system 100 to measure electrical data necessary to determine grounding faults (516). As explained above, the measurement can be the voltage potential between the grounded and grounding conductor in this example. After the monitoring devices 102 have measured the electrical data and communicated the electrical data to the grounding alert system 108, the data is evaluated based on the system hierarchy to determine whether improper grounding issues exist (518). As part of the evaluation, different subroutines may be called to determine additional information based on the electrical measurements relating to grounding issues. In order to perform the different evaluation subroutines, the algorithm 500 has access to a database 520 that stores codes, standards, and other user preferences. The database 520 may also store data validated by the user of proper N-G bonds in the system 100 that had been previously indicated by the grounding alert system 108 as a potentially improper N-G bond but later validated by the user as a proper N-G bond. The algorithm 500 also has access to configuration data such as location, evaluation periodicity, notification, alarming, zone setup, statistics and trending reminders, which are stored in a configuration file 522. All relevant data is stored for reporting, analysis, and future reference in the grounding alert system 108 in FIG. 3 (524).

The algorithm 500 determines whether the user configured the reporting requirements and output for the analyzed data (526). If the user has not configured the reporting requirements and output configuration, the algorithm 500 provides the evaluation information in default configuration reports (528) and ends. If the user has configured the reporting requirements, the output information is configured according to the user configuration (530) and the algorithm ends. Periodic re-evaluation may occur.

FIG. 5C is an exemplary subroutine of the block (518) shown in FIG. 5B for determining improper N-G bond points. The hierarchy of the power system 100 is stored (512), which represents the power system layout of devices in the power system 100 and how they are interconnected. The algorithm 518 initializes a variable N=1, and an expected $V_{ng}$ or $V_{ng, expected}$ to equal 0 (542). The grounding alert system 108 receives $V_{ng}$ data from Meter $M_N$ (544). As shown in FIG. 5B, the grounding alert system 108 may have received electrical data, including $V_{ng}$, from all of the monitoring devices 102 in the system 100 hierarchy. Alternately, the grounding alert system 108 may receive $V_{ng}$ from each monitored device in seriatim on an as-needed basis. The algorithm 518 determines whether Meter $M_N$ is at a proper N-G bond location (such as in compliance with the NEC code or as specified by the user in accordance with a local code, for example) (546). If so, the algorithm 518 sets $V_{ng, expected}=0$ (548). Otherwise, the algorithm 518 sets $V_{ng, expected}=V_{ng}$ of the Meter $M_N$ (550). It should be understood that the subscripts selected in this example (N, N+1) are determined based on the level in the hierarchy, the number of mains, etc. For example, referring to Table 1 and FIG. 3, Meter $M_{12}$ is directly connected to Meter $M_{121}$, which is directed connected to Meters $M_{1211}$ and $M_{1212}$. When iterating through Meter $M_{12}$'s path, the algorithm 518 sets $M_N=M_{12}$. $M_{N+1}$ becomes Meter $M_{121}$, and so forth. In other words, N+1 refers to the next meter under consideration, as determined by the known hierarchy and that meter's known relationship with the Meter $M_N$ under consideration.

The algorithm 518 receives $V_{ng}$ data from the next meter, Meter $M_{N+1}$, which is connected to and downstream of $M_N$ (552). The relative location of $M_{N+1}$ to $M_N$ is known from the stored system hierarchy 512. As mentioned above, the data from all of the meters 102 in communication with the grounding alert system 108 may be received by the grounding alert system 108 on an as-needed basis or en masse at predetermined or random intervals. The algorithm 518 determines whether $V_{ng}$ of Meter $M_{N+1}$ is greater than $V_{ng, expected}$ (554), preferably within a certain predetermined tolerance (e.g., $V_{ng, expected}$ may not need to be precisely 0 volts, but 0 volts within a predetermined tolerance, such as +/−0.10 volts). If so, N is incremented (556), and the algorithm 518 loops to block 544 as long as there are more meter combinations to be analyzed. If not, the algorithm 518 ends. If $V_{ng}$ of $M_{N+1}$ is not greater than $V_{ng}$, expected, the algorithm 518 stores data indicating that a potentially improper N-G bond exists near Meter $M_{N+1}$ (558). N is incremented (556), and block 544 onwards is repeated so long as there are more meter combinations to be analyzed. If not, the algorithm 518 ends. As emphasized above, electrical data from the meter need not be received in the order shown in FIG. 5C, but may be received in any order at the same time or at different times.

Figure 6:
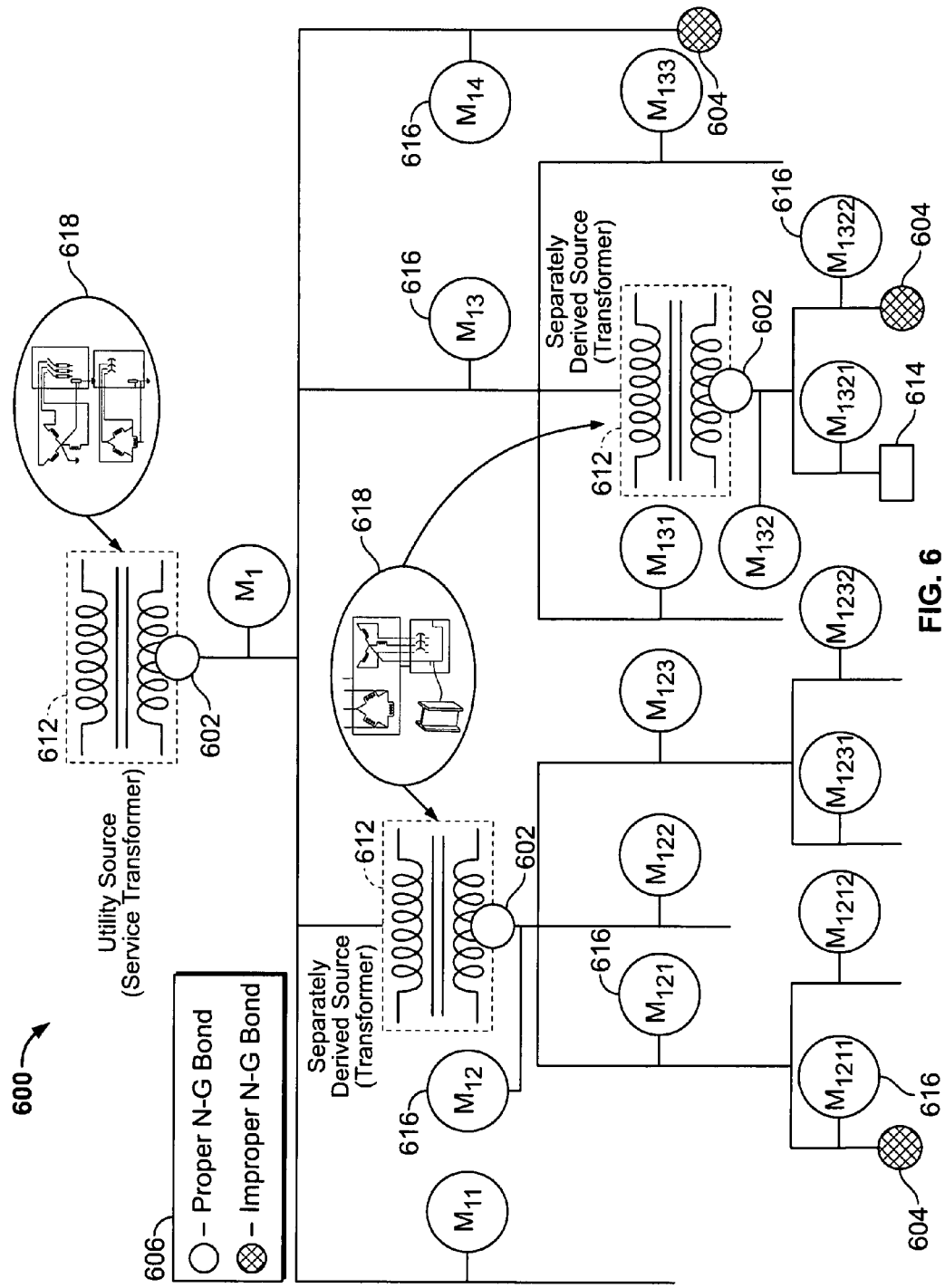
FIG. 6 is a graphical interface showing the location of potential grounded-grounding bonds according to the grounded-grounding bond detection system in FIG. 3.

An example of a graphical representation 600 depicting the resulting data from grounding alert system 108 in FIG. 3 is shown in FIG. 6. FIG. 6 shows a graphical representation 600 based on the utility system 100 shown in FIG. 3 and the data measured by the monitoring devices 102 in Table 1. For the sake of clarity, the automated data alignment system 104, the automated hierarchy classification system 106, and the automated grounding alert system 108 are not shown in FIG. 6, but would be communicatively coupled to the monitoring devices 616 in a similar manner as shown and described in connection with FIG. 3 above. The graphical representation 600 or information contained therein may be displayed to the user by a conventional video display (not shown). The graphical representation 600 schematically depicts the data that may be generated by the grounding alert system 108. Expected or proper N-G bonds are represented by expected N-G bond points 602. The expected N-G bond points are taken from the known hierarchical layout of the utility system 100 and confirmed by the measurements made by the monitoring devices 102 such as the data collected in Table 1 above. Unexpected or improper bonds are represented by unexpected or improper N-G bonds 604 based upon the data such as the data stored in Table 1 above. A legend box 606 may be shown, which includes a key legend to the bond points 602 and 604. The interface provides a user of immediate notification of each determined improper N-G bond and the area on the power system 100 to investigate (per the configuration of the process) via the layout on the graphical representation 600. Data may also be presented in a tabular format or some other format. If a user validates an N-G bond reading that the system found objectionable, then that validation may also be labeled in the graphical representation and legend or it may be ignored. The graphical representation (or textual format, etc.) may also indicate the zones or areas configured by the user.

The location of the improper, proper, and disregarded bonds may be graphically (or textually, etc.) indicated by icons to represent the location and interconnections of transformers 612, load devices 614, and meters 616. In addition, graphic or textual descriptions from the NEC (or other codes/standards) 618 may be shown to the user to more easily facilitate troubleshooting and correction of erroneous wiring configurations.

Aspects of the present invention may also allow the end-user to troubleshoot the source phase(s) of inappropriate N-G bonds by comparing the phase angle relationships of the residual current to each of the phase conductors (A, B, and/or C conductors). In most three-wire or delta-configured systems, there is typically no neutral connection because there is no neutral conductor. One of the phases in a grounded delta-configured system may be bonded to ground. In a four-wire system (wye or star-configured) or in a single-phase system, a neutral conductor represents a return path for load currents, unbalanced or unsymmetrical currents, some harmonic components, and/or some fault currents as required. If the phase currents and the neutral current are being measured, the residual current (i.e., the ground current) may be readily determined by simple calculations within the monitoring device 616 or other algorithms in the system software. Comparing the phase angle of each associated component from the calculated residual current (i.e., the ground current) to the phase angle of each phase conductor's current will indicate which phase or phases exhibit improper N-G bonds. A matching phase angle(s) signature indicates that the neutral return path for that specific phase is inappropriately bonded to the ground.

While particular embodiments and applications of the present invention have been illustrated and described, it is to be understood that the invention is not limited to the precise construction and compositions disclosed herein and that various modifications, changes, and variations can be apparent from the foregoing descriptions without departing from the spirit and scope of the invention as defined in the appended claims.

What is claimed is:

1. A method of detecting improper grounding in an electrical power system having a plurality of monitoring devices coupled to a grounded conductor and a grounding conductor or grounding plane, comprising:

receiving data of the voltage between the grounded conductor and the grounding conductor or grounding plane from the plurality of monitoring devices;

determining a hierarchy of the electrical power system, the hierarchy indicating how the monitoring devices are connected to one another in the electrical power system;

storing a representation of the hierarchy; and comparing the voltage data received from the plurality of monitoring devices to determine whether an improper grounded-grounding (N-G) bond exists between the grounded conductor and the grounding conductor or grounding plane by determining whether the voltage data from a first of the monitoring devices increases compared to the voltage data from at least a second of the monitoring devices that is downstream from the first monitoring device in the hierarchy of the electrical power system.

2. The method of claim 1, further comprising determining the location in the electrical power system of a bond between the grounded conductor and the grounding conductor or grounding plane based on the voltage data from some of the plurality of monitoring devices.

3. The method of claim 2, wherein the location is determined by designating the location of the monitoring device which reads the lowest voltage between the grounded conductor and the grounding conductor or grounding plane as the location of the bond.

4. The method of claim 2, further comprising displaying at least part of the electrical power system and the location of the bond between the grounded conductor and grounding conductor or grounding plane.

5. The method of claim 2, further comprising comparing a location of a known bond with the determined bond location.

6. The method of claim 5, further comprising confirming the existence of the known bond.

7. The method of claim 5, wherein the determining whether an improper N-G bond exists includes determining that an improper N-G bond exists in response to the voltage data from the second monitoring device being lower relative to the voltage data from the first monitoring device.

8. The method of claim 5, further comprising determining the lack of a known bond in the hierarchy of the electrical power system.

9. The method of claim 1, wherein the first monitoring device is monitoring a separately derived source in the electrical power system.

10. A system to determine a bond between a grounding conductor or grounding plane and a grounded conductor in an electrical power system, the electrical power system including a plurality of monitoring devices, the system comprising:

a central controller coupled to the plurality of monitoring devices, the central controller receiving voltage data indicative of the potential voltage between the grounding conductor or grounding plane and the grounded conductor for each of the plurality of monitoring devices;

a memory coupled to the central controller including hierarchy data relating to the electrical power system, the hierarchy data indicating how the monitoring devices are connected to one another in the electrical power system; and wherein the central controller determines whether an improper grounded-grounding (N-G) bond exists between the grounding conductor or grounding plane and the grounded conductor by determining whether the voltage data received from a first of the plurality of monitoring devices increases compared to the voltage data received from a second of the monitoring devices that is downstream from the first monitoring device in the electrical power system based on the hierarchy data.

11. The system of claim 10, wherein the controller determines the location in the electrical power system of the bond based on the voltage data from at least some of the plurality of monitoring devices.

12. The system of claim 11, further comprising a display coupled to the central controller.

13. The system of claim 12, wherein the display shows at least part of the electrical power system and the location of the bond between the grounded conductor and grounding conductor or grounding plane.

14. The system of claim 12, wherein the display shows a circuit diagram of at least one component of the electrical system.

15. The system of claim 11, wherein the location is determined by designating the location of the monitoring device which reads the lowest voltage between the grounded conductor and the grounding conductor or grounding plane as the location of the bond.

16. The system of claim 11, wherein the central controller compares a location of a known bond with the determined bond location.

17. The system of claim 16, wherein the central controller confirms the existence of the known bond.

18. The system of claim 16, wherein the central controller determines the existence of an illegal bond.

19. The system of claim 16, wherein the central controller determines the lack of a known bond in the hierarchy of the electrical power system.

20. A method of detecting improper grounding in an electrical power system having a plurality of monitoring devices coupled to a grounded conductor and a grounding conductor or grounding plane, comprising:
    receiving data of voltage between the grounded conductor and the grounding conductor or grounding plane sensed from the plurality of monitoring devices;
    determining a hierarchy of the electrical power system, the hierarchy indicating how the monitoring devices are connected to one another in the electrical power system;
    storing a representation of the hierarchy;
    determining the location in the determined hierarchy of the monitoring device sensing the lowest voltage between the grounded conductor and the grounding conductor or grounding plane; and
    designating the location of a bond between the grounded conductor and the grounding conductor or grounding plane as the location of the determined monitoring device.

21. The method of claim 20, further comprising displaying to a user an indication as to whether the bond is a proper bond.

22. The method of claim 20, further comprising automatically determining, based on the hierarchy, a location where a proper neutral-ground bond should exist, and, when such a bond does not exist, displaying to a user an indication that the location requires a neutral-ground bond.

* * * * *